331-98. SR 07-20-71 XR 3,594,662

United States Patent

[11] 3,594,662

[72] Inventor John D. Crawford, Sr.
Owensboro, Ky.
[21] Appl. No. 887,194
[22] Filed Dec. 22, 1969
[45] Patented July 20, 1971
[73] Assignee General Electric Company

[54] H(GH FREQUENCY CAVITY OSCILLATOR
8 Claims, 4 Drawing Figs.

[52] U.S. Cl. 331/97, 331/98
[51] Int. Cl. H03b 5/18
[50] Field of Search 331/97, 98, 101, 102

*Primary Examiner*—John Kominski
*Attorneys*—Nathan J. Cornfeld, John P. Taylor, Frank L. Neuhauser, Oscar B. Waddell and Joseph B. Forman

ABSTRACT: A high frequency coaxial cavity oscillator is provided having improved tuning stability when subject to high vibration conditions. The oscillator is constructed to provide a maximum of coaxial symmetry to reduce the effects of vibrations. The oscillator further provides an improved heat radiating path from the internal portions of the oscillator.

PATENTED JUL 20 1971 3,594 662

INVENTOR:
JOHN D. CRAWFORD,
BY John P. Taylor
HIS ATTORNEY.

H(GH FREQUENCY CAVITY OSCILLATOR

BACKGROUND OF THE INVENTION

This invention relates to high frequency oscillators. In one aspect the invention relates to high frequency oscillators subject to severe vibrational stresses.

Tunable high-frequency oscillators such as, for example, a microwave cavity oscillator, are conventionally constructed with an outer metallic shell electrically connected to one electrode of a controlled charge carrier device such as a high frequency tube and an inner conductor coaxially located within the shell. The inner conductor is connected to second electrode of the device, the shell and the inner conductor forming a section of a coaxial line. For tuning purposes, a slideable tuning member is coaxially mounted inside the shell. The tuning member is made to axially slide on the inner conductor via a threaded member journaled through an end cap on the outer shell. To avoid rotation of the tuning member, as well as to provide electrical contact with the inner conductor, it is conventional to provide a metallic terminal pin on the tuning member to extend eccentrically through an insulated portion of the end cap. However, in this type of construction the eccentrically mounted pin provides a cantilever effect upon the tuning member when the oscillator is subject to vibrational stresses.

SUMMARY OF THE INVENTION

It is therefore an object of the invention to provide a high frequency cavity oscillator having improved tuning stability. It is another object of the invention to provide an oscillator having improved heat-conducting means. These and other objects of the invention will be apparent from description and the drawings.

Briefly considered, in accordance with a preferred embodiment of the invention a high-frequency oscillator is provided comprising: a first elongated hollow conductor member, a high frequency controlled charge carrier device disposed within a first end of the member and having a first electrode electrically connected to the member, a second conductor member symmetrically disposed within the first member and electrically connected at one end thereon to a second electrode of the controlled-charge carrier device, spline means on an opposite end of the second member, end cap means within the opposite end of the first member including heat conducting electrically insulating means, an adjustable tuning member slidably received in the first member, and having central aperture means thereon cooperating with the spline means to allow nonrotational, axial displacement of the tuning member in the first member, and adjusting means accessible through the end cap means for axially displacing the tuning member in the first member.

The invention will be further understood by referring to the drawings and the description of the preferred embodiments.

DESCRIPTION OF THE PREFERRED EMBODIMENTS

Figures 1, 2, 3, 4:
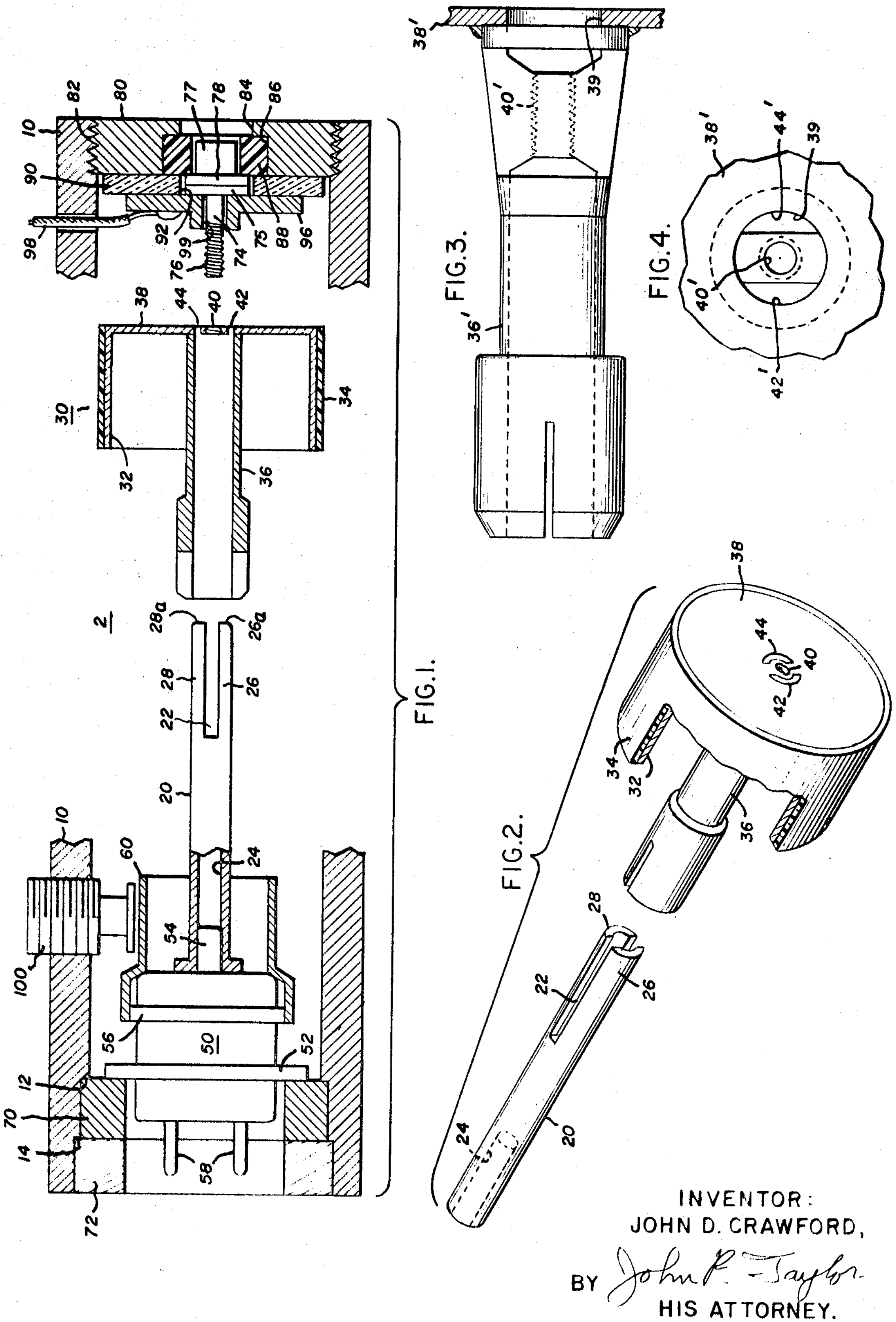
FIG. 1 is a partially exploded, horizontal cross section view of the invention.
FIG. 2 is an isometric view of a portion of FIG. 1.
FIG. 3 is a cross section view of another embodiment.
FIG. 4 is an end view of the embodiment illustrated in FIG. 3.

Referring now to FIG. 1, a high frequency oscillator is generally indicated at 2 comprising a section of coaxial transmission line having an outer conductor 10 which also acts as the shell or wall of the device, and an inner conductor 20 coaxially mounted withing conductor 10. Oscillator 2 further comprises a high frequency controlled charge carrier device 50 and a slideable tuning member or choke 30 useful to effect tuning. The output of the oscillator is derived through output probe 100 which passes through outer wall 10. In the illustrated embodiment, device 50 is a metal-ceramic planar tube having cathode, anode and grid electrodes respectively connected to a cathode ring 52, and anode cap 54, a grind ring 56. The cathode, as is well known, is indirectly heated from a source (not shown) connectable to heater pins 58. While the high frequency cavity oscillator is illustrated as powered by a tube it is to be understood that the oscillator of the invention can be used with other controlled charge carrier devices such as solid state devices as well.

Tube 50 is mounted in one end of outer conductor 10 by retaining rings 70 and 72 which rest respectively on shoulders 12 and 14 formed in the inner bore of conductor 10. Ring 70 is bonded to cathode ring 52 and provides electrical connection between the cathode of tube 50 and outer conductor 10. Ring 70 is bonded to cathode ring 52 and provides electrical connection between the cathode of tube 50 and outer conductor 10. Ring 72, which can be of any suitable insulating or conducting material is fitted within the bore of outer conductor 10 and retained therein by any suitable means such as a press fit or screw thread.

A grid sleeve 60 is mounted on grid ring 56 to form a hollow conductor coaxial with outer conductor 10. Inner conductor 20, comprising a metallic shaft having a coaxial bore 24, is mounted on anode cap 54 by pressing anode cap 54 into bore 24. The opposite end of conductor 20, as best seen in FIG. 2, is slotted at 22 to provide fork or spline portions 26 and 28. Spline portions 26 and 28 cooperate with means on tuning member 30 to prevent rotation of tuning member 30 as will be described below.

Slideable tuning choke 30 comprises a cylindrical plunger 32 of conductive material faced with a layer 34 of insulative material which is slideably received in the bore of outer conductor 10. A central, hollow stem 36 attached to plunger 32 slideably fits over conductor shaft 20. As best seen in FIG. 2, end wall 38 is provided with a central threaded aperture 40 and two semicircular openings 42 and 44 disposed adjacent opposite sides of aperture 40. Openings 42 and 44 correspond in dimensional cross section to the cross-sectional dimensions of splines 26 and 28 on inner conductor 20. The spacing of openings 42 and 44 are also indentical with the spacing of splines 26 and 28. Thus when central stem 36 of choke 30 is fitted over conductor shaft 20 and slid toward tube 50, splines 26 and 28 pass through openings 42 and 44 to secure choke 30 in slidable, nonrotatable relationship to conductor 20.

Oscillator 2 is tuned by sliding choke 30 via a threaded member 74 journaled to an end plate 80 which is threadedly received at 82 in one end of outer conductor 10. Threaded member 74 is received in threaded aperture 40 on choke 30.

Threaded member 74 comprises a rod having threads 76 cut thereon adjacent one end and an integrally formed shoulder 75 adjacent head 77 of member 74. Head 77 has an Allen wrench socket (not shown) formed therein to enable rotation of member 74.

End cap 80 is formed with a central opening 84 and a recessed bore 86 which receives an insulating washer 88. A split-ring-type lock washer 78 on member 74 frictionally engages shoulder 75 on member 74 and end cap 80 through insulating washer 88 which serves to electrically insulate end cap 80 from member 74.

An electrically insulating heat conducting member 90 which may be, for example, a washer made of berylia, abuts end cap 80 to electrically insulate cap 80 from an anode terminal washer 96. Anode terminal washer 96 frictionally bears against ends 26*a* and 28*a* of splines 26 and 28 and serves to provide electrical communication from the anode cap 54 via conductor 20 to an external wire 98.

As shown in FIG. 1, member 90 is provided with a central bore 92 which is sufficiently large to permit shoulder 75 on member 74 and lock washer 78 to pass therethrough. In contrast, anode washer 96 has a central bore 99 which is smaller than shoulder 75 but sufficiently large to permit the threaded portion 76 of member 74 to pass therethrough.

When the oscillator is assembled end cap 80 is threaded into shell 10 causing insulator 90 to urge anode washer 96 against ends 26a and 28a of inner conductor 20. Threaded member 74 is then rotatably retained by the immobility of anode washer 96 bearing against shoulder 75 and insulating washer 88 bearing against lock washer 78. In this regard it should be noted that insulator 90 is appropriately sized in thickness to be slightly less than the combined thickness of shoulder 75 and lock washer 78 in its uncompressed condition. The assembled parts just described thereby not only form a journal to retain threaded member 74, but by compressing lock washer 78 provide an antibacklash bearing as well.

Oscillator 2 is tuned by rotating member 74 via an Allen wrench inserted into head 77. Threaded member 74 is, as discussed above, axially immobilized while choke 30, into which member 74 is threaded via threaded bore 40, is rotationally immobilized by splines 26 and 28. Thus, rotation of member 74 causes axial displacement of choke 30 within oscillator 2 without imparting rotational movement to choke 30.

It should also be noted that inner conductor 20 conducts the heat generated adjacent anode cap 54 to the outside of oscillator 2 through an electrically insulated heat path from anode washer 96 through berylia washer 90 to end cap 80. This construction is made possible by the excellent heat-conducting properties of berylia while also serving as an electrical insulator. Thus, end cap 80 may be made of metal for mechanical strength and heat conduction yet will not carry the anode voltage which could result in electrical shock to the user.

The oscillator of the invention therefore provides a construction which maximizes coaxial symmetry to avoid imbalance of parts which would cause instability upon exposure to vibrational stresses.

FIGS. 3 and 4 illustrate an alternate embodiment for receiving splines 26 and 28 into nonrotational engagement with choke 30. In this embodiment, central stem 36′ is provided with a threaded bore 40′ and side bores 42′ and 44′ conforming to the size and spacing of splines 26 and 28. End wall 38′ is then provided with a central opening 39 of sufficient diameter to allow splines 26 and 28 to pass therethrough. For convenience, stem 36′ can be formed, as illustrated, as a separate member and later brazed to the inner surface of end cap 38′. This construction provides for greater mechanical strength of the wall portions adjacent the threaded bore 40′ as well as enabling the use of a greater number of threads on the wall of bore 40′ itself.

My invention therefore provides a high frequency oscillator having a coaxially symmetrical structure wherein rotation of the tuning member is prohibited by coaxial means which do not impart turning instability to the oscillator when it is subject to vibrational stresses. The invention also provides a heat radiation path from the inner portion of the oscillator, while specific embodiments of the invention have been illustrated, minor modifications of the invention will be readily apparent to those skilled in the art and are deemed to be within the scope of the invention defined in the appended claims.

What I claim as new and desire to secure to Letters Patent of the United States is:

1. A high-frequency oscillator comprising:

a. a first elongated hollow conductor member, b. a high frequency controlled charge carrier device disposed within a first end of said member and having a first electrode electrically connected to said first member, c. a second conductor member symmetrically disposed within said first member and electrically connected at one end thereon to a second electrode of said controlled charge carrier device, d. spline means on an opposite end of said second member, e. end cap means within the opposite end of said first member including heat conducting electrically insulating means, f. an adjustable tuning member slideably received in said first member, and having central aperture means thereon cooperating with said spline means to allow nonrotational axial displacement of said tuning member in said first member, and g. adjusting means accessible through said end cap means for axially displacing said tuning member in said first member.

2. The oscillator of claim 1 wherein said central aperture means on said tuning member comprise openings on said tuning member, said openings are dimensioned to conform to the cross-sectional dimensions of said spline means, and said spline means pass through said openings.

3. The oscillator of claim 2 wherein said tuning member further carries a threaded bore coaxially disposed therein, and said adjusting means comprises a threaded bolt received in said threaded bore.

4. The oscillator of claim 3 wherein said threaded bolt is provided with shoulder means and a washer on said bolt having a first side in contact with said spline means and an opposite side in contact with said end cap means through said heat conducting electrically insulating means, said spline means, shoulder means, washer, and end cap means cooperating to provide an axially fixed journal for said threaded bolt and to further provide a heat path from said second conductor to said end cap to dispose of excess heat generated within said oscillator.

5. A high-frequency oscillator comprising:

a. a first elongated hollow conductor member, b. a high frequency controlled charge carrier device disposed within a first end of said member and having a first electrode electrically connected to said first member, c. a second conductor member symmetrically disposed within said first member and electrically connected at one end thereon to a second electrode of said controlled charge carrier device, d. spline means on an opposite end of said second member, e. an adjustable tuning member coaxially mounted within said first member in slideable relationship on said second member, and having central aperture means thereon to receive portions of said spline means therein to prevent rotation of said tuning member relative to said first member, and f. adjusting means carried by said end cap means and operationally attached to said tuning member for axially displacing said tuning member in said first member.

6. The oscillator of claim 5 wherein said adjusting means comprise a threaded bolt and said central aperture means includes a coaxially disposed threaded bore to receive said bolt.

7. The oscillator of claim 6 wherein said threaded bolt is retained in said end cap means by journal means including a metallic washer on said bolt having a first side in contact with said spline means and an opposite side in contact with said end cap means through electrically insulating heat conducting means.

8. The oscillator of claim 7 wherein said electrically insulating heat conducting means includes a beryllium washer.